(12) United States Patent
Horiuchi

(10) Patent No.: US 6,730,964 B2
(45) Date of Patent: May 4, 2004

(54) SEMICONDUCTOR DEVICE AND METHOD OF PRODUCING THE SAME

(75) Inventor: Masatada Horiuchi, Koganei (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/260,656

(22) Filed: Oct. 1, 2002

(65) Prior Publication Data

US 2003/0034524 A1 Feb. 20, 2003

Related U.S. Application Data

(63) Continuation of application No. 09/381,399, filed as application No. PCT/JP98/03249 on Jul. 21, 1998, now Pat. No. 6,538,268.

(30) Foreign Application Priority Data

Jul. 22, 1997 (JP) .............................. 9-196206

(51) Int. Cl.$^7$ .................. H01L 27/01; H01L 27/12; H01L 31/0392
(52) U.S. Cl. .................. 257/347; 257/349; 257/617
(58) Field of Search ................ 257/347, 349, 257/617

(56) References Cited

U.S. PATENT DOCUMENTS

| 5,040,037 A | * 8/1991 | Yamaguchi et al. | 257/347 |
| 5,475,244 A | 12/1995 | Koizumi et al. | 257/192 |
| 5,698,869 A | 12/1997 | Yoshimi et al. | 257/192 |
| 6,528,851 B1 | * 3/2003 | Yu | 257/347 |
| 2002/0079544 A1 | * 6/2002 | Shino | 257/388 |

FOREIGN PATENT DOCUMENTS

| JP | 62-274778 A | 11/1987 |
| JP | 2-186677 A | 7/1990 |
| JP | 9-116112 A | 5/1997 |
| JP | 9-139434 A | 5/1997 |

OTHER PUBLICATIONS

Ohno et al. "Suppression of the Parasitic Bipolar Effect In Ultra–Thin–Film nMOSFETs/SIMOX by Ar Ion Implantation into Source/Drain Regions" 1995 IEEE, 12/10–13/95.
Ploeg et al., "Elimination of Bipolar–Induced Breakdown in Fully–Developed SOI MOSFETs" 1992 IEEE. 12/13–16/92.
Horiuchi, Semiconductor Device and Its Method of Manufacture (English translation of Japanese patent application JP–9–139434).
Extended Abstracts (The 2$^{nd}$ Spring Meeting, 1995) the Japan Society of Applied Physics and Related Societies, p. 755.

* cited by examiner

*Primary Examiner*—Ngân V. Ngô
(74) *Attorney, Agent, or Firm*—Antonelli, Terry, Stout & Kraus, LLP

(57) ABSTRACT

A semiconductor device has a MOSFET formed on a single crystalline silicon layer in an SOI structure in which the silicon layer is laminated along with an insulator on a handle wafer. To prevent the body floating effect, a recombination center region is formed connecting to the lower surfaces of source and drain regions of the MOSFET. Consequently, the holes generated within the single crystalline silicon layer just beneath a channel of the MOSFET are injected into the recombination center region by way of the single crystalline silicon layer beneath the source diffusion region and eliminated so that the body floating effect is prevented.

7 Claims, 10 Drawing Sheets

MEMORY CELL

SEMICONDUCTOR DEVICE AND METHOD OF PRODUCING THE SAME

This is a continuation of parent application Ser. No. 09/381,399 filed Sep. 20, 1999 now U.S. Pat. No. 6,538,268, which is a PCT/JP98/03249 filed Jul. 21, 1998 the entire disclosure of which is hereby incorporated by reference.

BACKGROUND OF THE INVENTION

1. Field of the Invention

The present invention relates to a semiconductor device and a method for producing the same, more specifically this invention relates to a semiconductor device to effectively prevent the body floating effect and various related problems in MOS field effect transistors formed on a SOI (silicon-on-insulator) substrate, and a method for easily producing the semiconductor device.

2. Description of Related Art

A semiconductor device having various elements such as transistors formed on a single crystalline silicon layer formed on an insulator is known as a structure called SOI (Silicon On Insulator). The structure shown in FIG. 2 for example is disclosed on page 755 of the Extended Abstracts (the Spring Meeting, 1995) The Japan Society of Applied Physics and Related Societies. The MOS field effect transistor (hereafter simply referred to as MOS) is formed on a single crystalline silicon (Si) layer 3 separated from a handle wafer 1 by a thick insulator 2. The reference numeral 4 in FIG. 2 indicates a device isolation layer, the numeral 5 indicates a gate insulator, the numeral 6 is a gate electrode, the numeral 7 is a gate electrode protection insulator, the numeral 8 is a gate side-wall insulator, the numerals 9 and 10 are n-type highly concentrated impurity diffusion regions with respective drain and source regions.

The special feature of SOI-MOS of the conventional art as shown in FIG. 2, is that a thick device insulation layer 2, is present directly beneath the single crystalline silicon (Si) layer 3 so that the parasitic wiring capacitance and the drain junction capacitance are reduced to approximately one-tenth of the capacitance of an ordinary MOS formed on an Si substrate. Another feature is that the MOS is also isolated by insulation from the handle wafer 1 so that misoperation due to alpha ray beam irradiation and latch-up phenomenon are essentially eliminated.

However, in an SOI-MOS device of this type, the single crystalline silicon (Si) layer 3 is completely isolated from the handle wafer 1 so that minority carriers (holes) generated for example, by the strong electrical field of the drain tend to transiently accumulate within the single crystalline silicon (Si) layer 3 and cause a shifting threshold voltage or so-called body floating effect. This body floating effect can be viewed as the parasitic bipolar effect that causes majority carriers to flow in as a result of a rise in electrical potential due to accumulation of minority carriers within the single crystalline silicon (Si) layer 3. In n-channel SOI-MOS devices, (hereafter abbreviated to n-SOI-MOS) the threshold voltage fluctuates in the negative direction due to the accumulated holes and an abnormal bump can be observed in the device current/voltage characteristics (kink characteristic). This condition causes problems such as a large leakage current when the device is in the off state and a lowering the source and drain breakdown voltage which can be a fatal defect in differential amplifiers and analog circuits which must detect tiny differences in the electrical current.

In the SOI-MOS device shown in FIG. 2, in order to prevent the above mentioned body floating effect, germanium (Ge) is ion-implanted into a source highly concentrated impurity diffusion region 9 and a SiGe alloy 14 with a Ge content of approximately 10 percent is formed. FIG. 3 shows the energy band diagram along the channel when a voltage is applied to the drain of the SOI-MOS device in FIG. 2. In FIG. 3, $E_{Fn}$ is the pseudo-fermi level and $E_i$ is the intrinsic fermi level. The bandgap narrows by approximately 0.1 eV by forming the SiGe alloy 14, the valence band $E_v$ for the source is formed as shown by the broken line, and the difference in hole diffusion potential is reduced. As a result, the holes generated near the drain and accumulating within the single crystalline silicon (Si) layer 3 tend to diffuse within the source and be eliminated. The conduction band $E_c$ is unaffected by the SiGe alloy 14 and there are no adverse effects on the behavior of electrons which are majority carriers.

However, due to control of the valence band at the source junction the structure shown in FIG. 2 is inadequate for eliminating the body floating effect in p-channel SOI-MOS devices (hereafter abbreviated to pSOI-MOS), and when germanium (Ge) is introduced into the source region of the pSOI-MOS device, the difference in diffusion potential drops and the breakdown voltage deteriorates. Further, in nSOI-MOS devices since the body floating effect cannot be adequately eliminated, and an excessive amount of germanium (Ge) of more than 10 percent is injected into the source region, the problem of crystalline defects occurs due to the difference in lattice constants of the Si (silicon) and Ge (germanium). The only way to eliminate the crystalline defects is to reduce the Ge (germanium) content however, the improved drop in diffusion potential does not amount to more than approximately 0.1 eV which is inadequate to eliminate the body floating effect.

The SOI-MOS device of FIG. 4 is disclosed on page 627 of the Extended Abstracts of the 1995 International Electron Devices Meeting and the SOI-MOS device of FIG. 5 is disclosed on page 337 of the Extended Abstracts of the 1992 International Electron Devices Meeting.

In the SOI-MOS device of FIG. 4, after forming the source and drain diffusion regions 9 and 10, argon (Ar) is ion-implanted and a recombination center region 15 formed within the source and drain, and the holes that accumulated inside the single crystalline silicon (Si) layer 3 are eliminated. However, unless the position of the recombination center region 15 versus the drain junction is optimal, then the leakage current tends to increase so that also eliminating the holes within the single crystalline silicon (Si) layer 3 is extremely difficult.

In the SOI-MOS device of FIG. 5 however, a portion of the junction of the bottom of the source 9 is destroyed by a spike 16 resulting from abnormal diffusion of a metal electrode and the holes within the single crystalline silicon (Si) layer 3 are eliminated by this spike 16. In this structure, in order to maintain a flow path for the positive holes, from the single crystalline silicon (Si) layer 3, a portion below the bottom of the source 9 is used as the P-type highly concentrated impurity region, and a portion below the drain 10 is used as an N-type highly concentrated impurity region to prevent the spike 16 from causing a deterioration in the transistor characteristics. As a result, the source 9 and the drain 10 are not symmetrical and the device is not usable in general purpose.

SUMMARY OF THE INVENTION

Accordingly it is an object of the present invention to resolve the above mentioned problems with the SOI-MOS device of the conventional art in FIG. 2, by providing an SOI-MOS device having a new structure and a production method for this device, applicable even to p-SOI-MOS devices as well as complementary SOI-MOS devices and further capable of preventing crystalline defects in the active region and the body floating effect.

It is a further object of the present invention to resolve the above mentioned problems with the SOI-MOS device of the conventional art in FIG. 4, by providing an SOI-MOS device having a new structure and a production method for this device, to stop the occurrence of defects in the active regions of the source and drain and also adequately prevent the body floating effect.

A yet further object of the present invention is to resolve the above mentioned problems with the SOI-MOS device of the conventional art in FIG. 5, by providing an SOI-MOS device having a new structure and a production method for this device, that is widely applicable to semiconductor integrated circuits having a symmetrical structure of source and drain, and also prevents the body floating effect.

A still further object of the present invention is to provide an SOI-MOS device not utilizing new production technology, that can actively prevent the body floating effect and can easily be manufactured at a low cost with conventional production technology.

In order to achieve the above mentioned object of the invention, the semiconductor device has an MOS field effect transistor formed on the single crystalline silicon layer of the above mentioned SOI structure laminated along with an insulator on the handle wafer. The surface of the source region and the drain region of this MOS field effect transistor, are respectively connected to the source electrode and drain electrode by way of a contact hole (contact area) formed on a second insulator formed on the above mentioned single crystalline semiconductor layer. A recombination center region is formed connecting to the lower surface of the source region and drain region in the lower part of this contact hole of the single crystalline semiconductor layer.

Restated, as shown in FIG. 1, in the single crystalline Si layer 3 a recombination center region 20 is formed at the lower part of the contact area (contact hole) 19 electrically connected to a source diffusion region 9 and a drain diffusion region 10, and source electrode 12 and a drain electrode 13. Consequently, the holes generated within the single crystalline Si layer 3 just beneath the channel are injected into the recombination center region 20 by way of the single crystalline Si layer 3 beneath the source diffusion region 9 and eliminated so that the body floating effect is prevented.

This recombination center region 20 formed just beneath the drain diffusion region 10 might become a source of current leakage when drain voltage is applied, however the single crystalline Si layer 3 just beneath the drain diffusion region 10 is completely depleted by the application of a drain voltage so the leakage current flow path to the source diffusion region 9 is cut off and there is no possibility of current leakage flowing.

The operating principle of this invention resembles the operating principle of the junction field effect transistor (JFET). In a JFET, a voltage is applied to narrow the current path in the semiconductor region between the two matching junctions or in other words the amount of electrical current is regulated.

In contrast in this invention however, though the single crystalline Si layer 3 is cut off by the insulation layer 2, the current path, namely the amount of electrical current, is regulated by applying a voltage to one junction.

In this invention, it could be also said that, a JFET is embedded in the bottom of each source and drain of the SOI-MOS device.

The characteristics of the JFET embedded in the SOI-MOS, or in other words the elimination of holes on the source side (forward-direction hole current) and reverse-direction leakage current on the drain side, are determined by the thickness $\Delta t_{so1}$ of single crystalline Si layer 3 for the matching JFET channel and also by junction length (channel length) w from the recombination center region 20 to the single crystalline Si layer 3 just below the gate, and the impurity concentration Na versus that junction length w.

A computer simulation to find the forward-direction hole current or in other words, the electrical current to eliminate the body floating effect is shown in FIG. 6A. The leakage current characteristics for the drain region are shown in FIGS. 6B.

As FIG. 6A and 6B clearly show, even though the junction length w from the recombination center region 20 to the single crystalline Si layer 3 just below the gate is an extremely small 50 nm, if the impurity concentration Na for the single crystalline Si layer 3 contacting the bottom of the junction is approximately $10^{17}/cm^3$, then there is no possibility of leakage current occurring in the drain, a sufficient hole current can be maintained at the source side and the body floating effect can be eliminated.

In order to achieve the results of the above simulation, the thickness $\Delta t_{so1}$ of single crystalline Si layer 30 for the matching JFET channel is extremely critical which in turn requires strict control of the source and drain junction depth. The ion implantation method is normally utilized in forming these junctions. However, the problem of channeling phenomenon occurs if the crystal displacement axis and the ion implantation angle match each other when the junctions are formed with ion implantation. In this phenomenon, impurity concentrations below $10^{17}/cm^3$ in a region during ion implantation deviate widely from the Gauss distribution and distribute even deeper.

When this channeling phenomenon occurs during forming of the source and drain diffusion regions 9 and 10, the single crystalline Si layer 3 with a thickness $\Delta t_{so1}$ contacting the bottom of the junction, becomes an entirely n-type layer, making problems likely to occur in forming the JFET channel. Accordingly, when using ion-implantation to form source and drain diffusion regions, the ion-implantation angle should preferably be performed at the ±20 degrees tilted from the perpendicular to the substrate surface.

To achieve strict control of the source and drain junction depth, separate ion-implantation may be performed for forming drain diffusion region and counter-conductive atoms as well as to compensate for regions formed deeper than needed due to channeling phenomenon.

The above description, utilized N-type MOS devices for making the explanation simple however needless to say, a P-type MOS devices may be used in the same way with only the conduction conductive type of the impurities being reversed.

The insulator layer and the single crystalline Si layer laminated on the handle wafer, the MOS field effect transistor formed on a single crystalline semiconductor layer, a second insulator layer formed on the single crystalline semiconductor layer, and the source and drain region of this MOS field effect transistor, and a specified portion of the single crystalline semiconductor layer below this source and drain region are formed with a (through) hole. The recombination center region may be formed from the source region, drain region as well as the single crystalline semiconductor layer below these regions by filling this hole with a metal film. In such a case, the recombination center region dimensions are specified by means of the metal semiconductor junction. The upper surface of the recombination center region must make contact with the lower surface of the source and drain diffusion regions. The lower surface of the recombination center region however, may contact the upper surface of the insulator layer or may be separated from this insulator layer. By keeping the insulator layer separate, the metal/Si surface area can be widened and a large contact area (surface area of recombination center region) can be secured even if the hole area is reduced.

This recombination center region may use a region conducting in the opposite direction of the source region and drain region or the recombination center region may also utilize a non-single crystalline silicon region such as Polycrystalline silicon.

The drain and source regions respectively have structures with regions that extend at the edge of the channel of the MOS field effect transistor yet are shallower than the source and drain and also in the same conductive type as the source and drain regions. These regions suppress the widening of the depletion layer and improve the breakdown voltage. In such cases, the concentration of impurities in a shallow region in the same conductive type as source and drain may be set lower than in the source and drain regions.

A semiconductor device may comprise a plurality of MOS field effect transistors mutually connected in serial or may comprise these field effect transistors connected in series with capacitor devices. In such cases, the recombination center region is formed at the opposite node of these capacitor devices, and is formed at the lower surface of the source region or drain region. Also in this case, the single crystalline semiconductor layer below the drain diffusion region is structured to reach the depletion region at the boundary of the insulator layer, while a drain voltage is being applied. Attaining the depletion region in this way, cuts off the current leakage flow path to the source diffusion region 9 so there is no possibility of current leakage flow occurring.

In the method for manufacturing the semiconductor device of this invention, after forming the SOI substrate by laminate-forming the insulator layer and the single crystalline semiconductor layer in sequence on the handle wafer, the method of the known art is then utilized to form the MOS field effect transistor on the single crystalline semiconductor layer, and a second insulator layer is further formed over the entire surface. A contact hole is formed in the second insulator layer and a portion of the MOS field effect transistor source and drain regions exposed. Ion implantation is performed by utilizing this contact hole and the recombination center region is formed in contact with the lower surface of the source region and drain region within the single crystalline semiconductor layer.

In other words, this contact hole is a connecting hole for electrically connecting the source and drain diffusion regions to the respective source electrode and drain electrodes. Ion implantation through this contact hole is performed to form the recombination center region to contact the source and drain diffusion regions within the single crystalline semiconductor layer beneath this contact hole.

The element used in the ion-implantation may be a fundamental element selected from a group consisting of group IV fundamental elements, halogen fundamental elements and rare earth metal fundamental elements. This ion-implantation forms a non-single crystalline region in contact with the lower surface of the source and drain regions inside the single crystalline semiconductor layer as described above. A section of the single crystalline semiconductor layer selected as the region to become amorphous during application of the accelerated voltage in the ion-implantation application becomes Polycrystalline due to heat treatment performed in subsequent processes but will not return to the single crystalline state.

After forming the SOI substrate, MOS field effect transistor, second insulator layer, and the source region and drain region of the MOS field effect transistor as related for the manufacturing method, a (through) contact hole is formed in the source region and drain region as well as in a specified portion of the single crystalline semiconductor layer below these source and drain regions. By filling this contact hole with a metallic layer, a recombination center region is formed inside the single crystalline semiconductor layer and in contact with the lower surface of the source and drain regions. In such cases, the recombination center region is separated from the single crystalline (Si) layer by a metal-semiconductor junction.

Many types of semiconductor devices can be configured for example such as asynchronous transmission mode devices and processor devices by utilizing the semiconductor device of this invention.

DETAILED DESCRIPTION OF THE PREFERRED EMBODIMENTS

Figure 1:
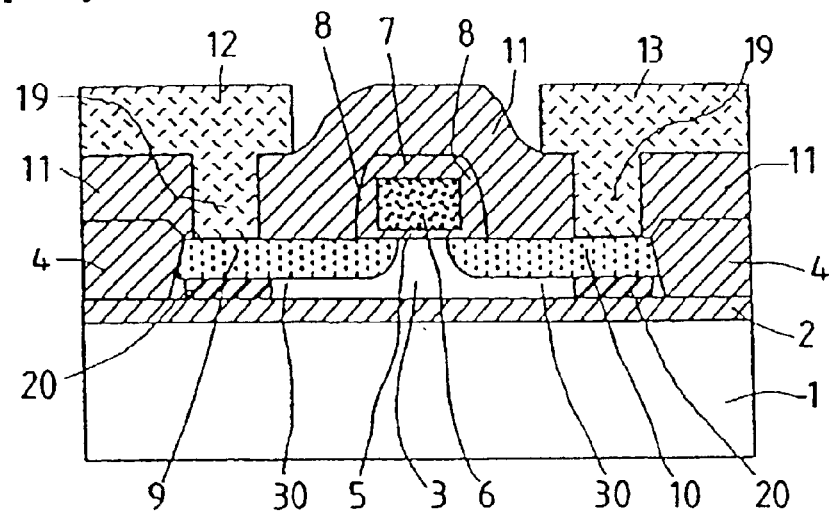
FIG. 1 is a cross sectional view showing the first embodiment of this invention.
Figure 2:
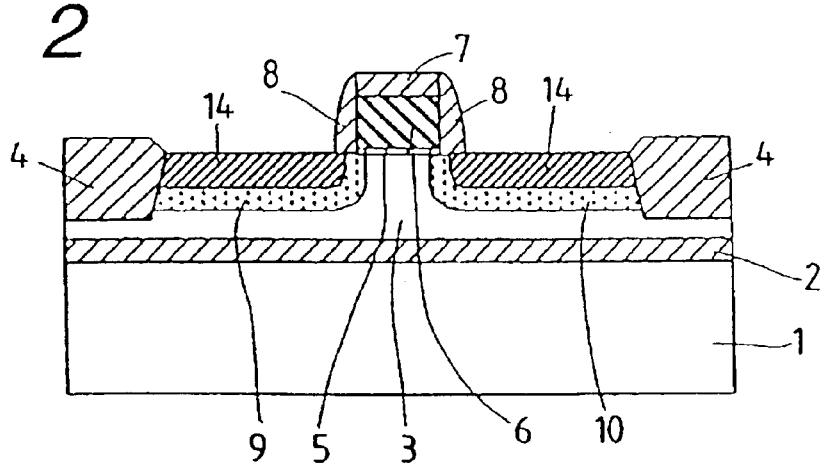
FIG. 2 is a cross sectional view showing the semiconductor device of the conventional art.
Figure 3:
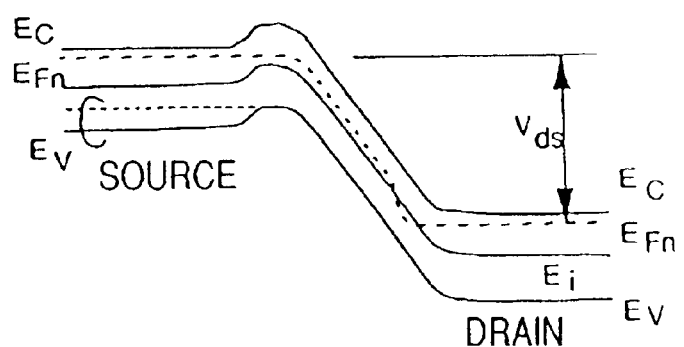
FIG. 3 is a graph showing the energy band diagram illustrating the elimination of the body floating effect in the semiconductor device of the conventional art.
Figure 4:
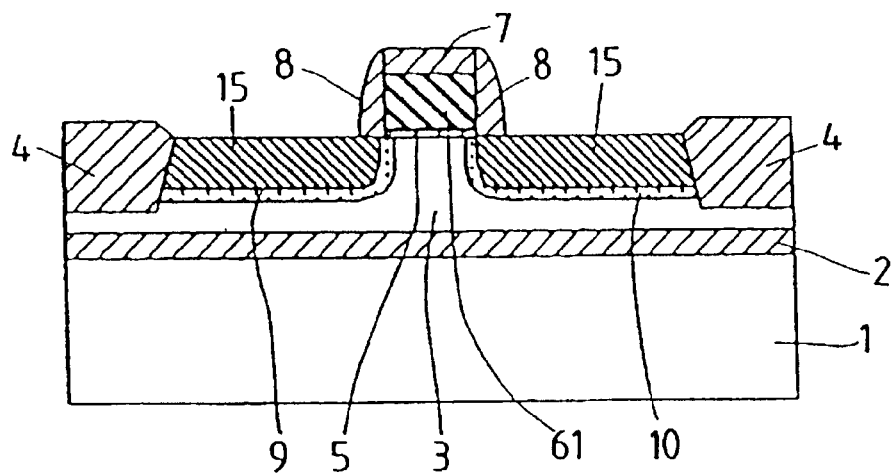
FIG. 4 is a cross sectional view showing the semiconductor device of the conventional art.
Figure 5:
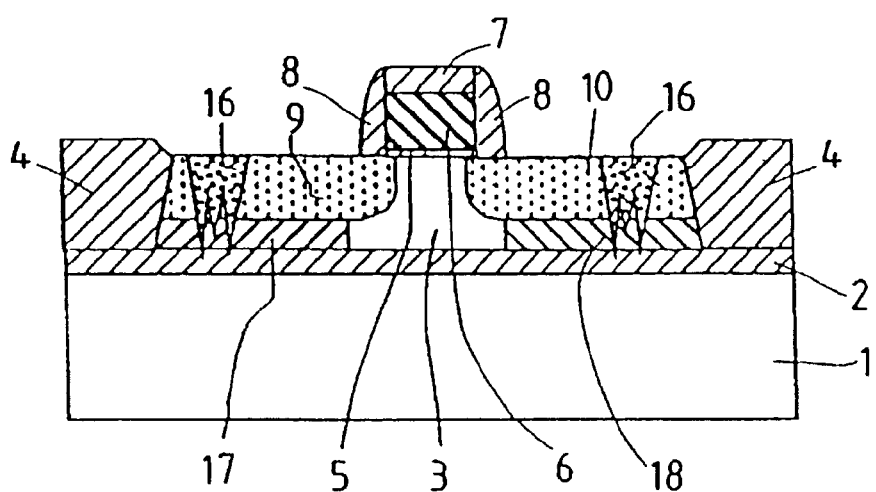
FIG. 5 is a cross sectional view showing the semiconductor device of the conventional art.
Figure 6A:
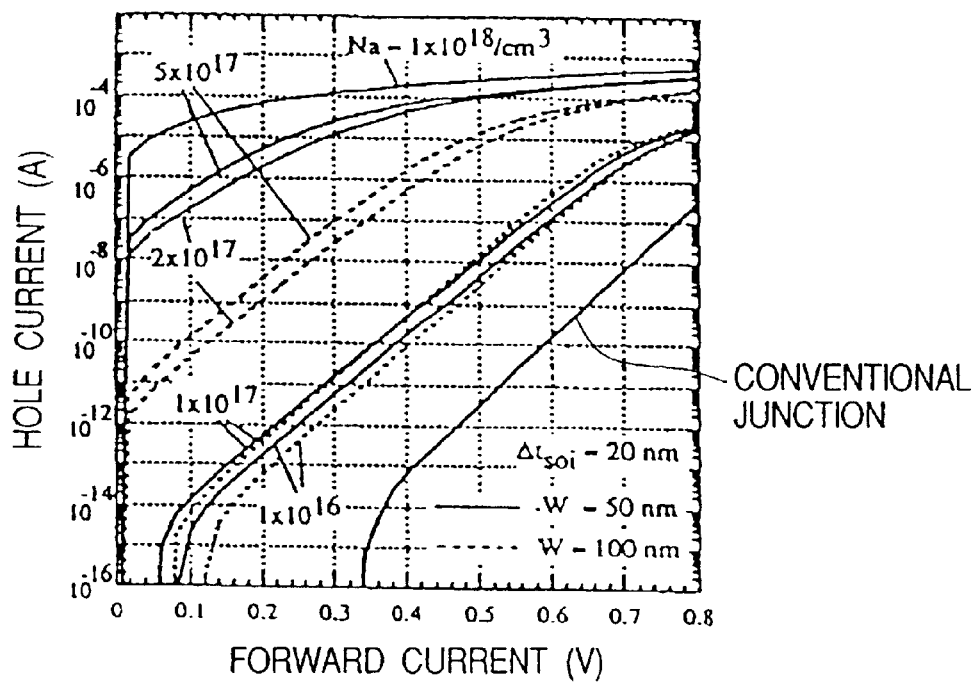
FIGS. 6A and 6B are graphs showing the effect of the invention.
Figure 6B:
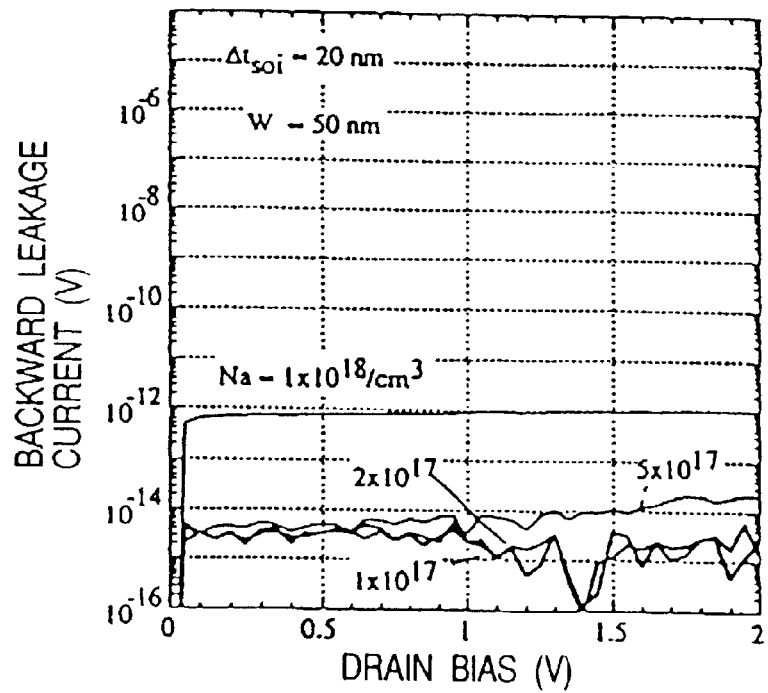

In this invention, holes emitted by the strong electric field of the drain are accumulated in the single crystalline Si layer 3, recombined with electrons in the recombination center region and eliminated. Ion implantation through the contact hole 19 which is connecting holes for the source and drain electrodes 12 and 13 to form the recombination center region 20 is the most effective method.

A material that will not form a barrier against the injection of holes current in the implanted region is selected as the fundamental element for ion implantation. Rare earth gas fundamental elements such as neon (Ne), argon (Ar), Group IV fundamental elements such as Si, Ge or halogen fundamental elements such as chlorine (Cl) may be utilized. Boron (B) that will form a P-type conduction region may also be implanted in the case of nMOS. However, when ions are implanted to form N conductive material such as phosphorus (P) and arsenic (As) then a barrier to the flow of holes is formed, the flow of holes in the recombination center region 20 becomes difficult and the ability to eliminate the body floating effect is drastically weakened so this material is not preferred.

In the ion implantation sequence, the ion implantation dosage is set so that the single crystalline Si layer 3 will become amorphous and the implantation energy set so that the amorphous region will reach the insulator layer 2. The amorphous region (recombination center region 209 formed on the insulator layer 2 by means of ion implantation, maintains a Polycrystalline condition without regrowing to the single crystalline condition in the subsequent manufacturing processes normally performed with heat treatment at 1000 degrees centigrade and functions as a satisfactory recombination center region. Ion species with an atomic weight of less than 10 are not preferred for use as ion species because of the difficulty in effectively forming an amorphous layer. Further, alkali metals such as Na, and K as well as rare earth metals containing magnesium are not preferred since their diffusion coefficient inside the single crystalline Si layer 3 is exceedingly large and might cause the reliability of the SOI-MOS device to deteriorate.

The injection angle for ion implantation when forming the source and diffusion layer 9 and 10 in this invention is prone to cause the channeling phenomenon to occur when perpendicular to the main surface of the SOI substrate 1 so a perpendicular injection angle is not preferred. In order to prevent the channeling phenomenon from occurring, an injection angle tilted 10 to 30 degrees from the perpendicular position relative to the main surface of the SOI substrate 1 is preferred. Ion implantation applied in this way will cause little spread in the low concentrated impurity region, form source and drain diffusion regions 9 and 10 having a sharp distribution and leave a single crystalline Si layer 30 having a low concentration of P-type impurities of the specified thickness below the source and drain layers 9 and 10.

Hereafter, this invention is described by utilizing the embodiments. In order to simplify the explanation, the drawings are shown with the essential portions enlarged. Factors such as the material, conduction and manufacturing conditions are not limited to the examples listed in these embodiments and numerous adaptations are possible for each embodiment.

(First Embodiment)

Figure 7:
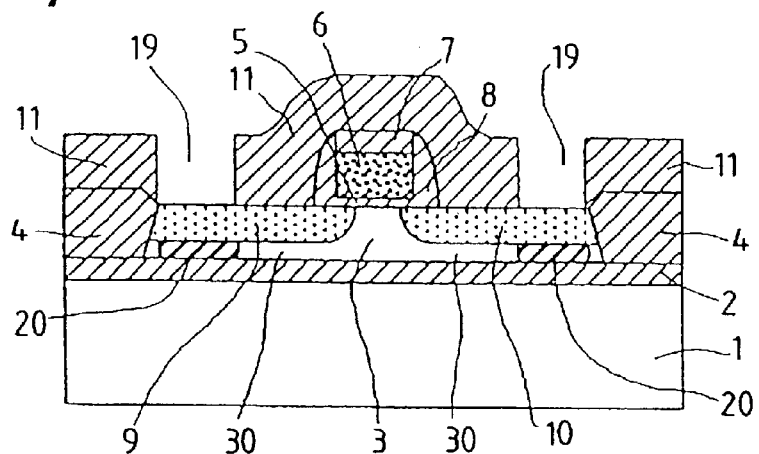
FIG. 7 is a cross sectional view showing the first embodiment of this invention.

A cross sectional view for describing the first embodiment of this invention is shown in FIG. 7.

An SOI substrate is formed of a silicon oxide insulator (hereafter abbreviated to simply oxide insulator) 2 with a thickness of 300 nm and a single crystalline silicon layer 3 having a p-type impurity concentration of $1 \times 10^{16}/cm^3$, crystal surface orientation (100) laminated onto the handle wafer 1 constituting the single crystalline Si wafer with a diameter of 20 centimeters. A device isolation layer 4, a 5 nm thick gate insulator 5 and a gate electrode 6 made from an N-type low-resistance Polycrystalline Si layer as well as a gate electrode protection insulator 7 are formed on the single crystalline silicon layer 3 utilizing a manufacturing method of the known art for a MOS field effect transistor. To form the gate insulator 5, ion implantation is selectively performed on the region planned for forming the gate electrode of the single crystalline silicon layer 3. This ion implantation may be performed after the gate insulator 5 is formed. The gate length was formed at a length of 200 nm.

Implantation of arsenic (As) ions was performed under conditions of a dosage of $3 \times 10^{15}/cm^2$ and an acceleration voltage of 25 keV for use of the gate electrode protective insulator 7 and the gate electrode 6 as an implantation screen mask. Heat treatment for single crystallization was performed and a source diffusion region 9 of highly concentrated N-type impurities and a drain diffusion region 10 of highly concentrated N-type impurities were formed. This ion implantation process was performed twice at an ion injection (input) angle of ±20 degrees relative to a perpendicular to the handle wafer 1.

Upon measuring the depth profile concentration distribution of arsenic ions implanted in a sample treated under the same conditions as this embodiment, the channeling phenomenon was found to be greatly reduced, a junction depth of 180 nm at a concentration of $1\ 10^{15}/cm^2$ and an extremely sharp impurity distribution was achieved.

The p-type single crystalline silicon layer 3 remaining underneath the source and drain junction therefore had a thickness of 180 nm in this embodiment. The concentration profile of impurities in this p-type single crystalline silicon layer 3 can be set to the desired concentration profile by utilizing a method such as ion implantation.

After forming a silicon nitride layer with a thickness of 200 nm over the entire surface by utilizing a CVD (chemical vapor deposition) method of the known art, anistrophic dry etching was performed and only a silicon nitride layer selectively left on the side wall of the gate electrode 6, the other portions are removed and a gate side-wall insulator 8 thus formed.

An inter-metal insulator 11 is formed from a silicon oxide insulator doped with P impurities and contact hole 19 (contact areas) then formed in the desired location by photo etching using the method of the known art to form the structure shown in FIG. 7.

Next, Si ion implantation with a high ion dosage was performed in the single crystalline silicon layer 30 beneath the contact hole 19 and an amorphous recombination center region 20 formed. The implantation energy for this ion implantation was set to obtain a maximum concentration at the interface of the oxide insulator 2 and performed under conditions of an acceleration energy of 130 keV and an implantation dosage of $2\times10^{15}/cm^2$. After this ion implantation, the highest temperature of the heat treatment performed up to the final manufacturing process was 750 degrees centigrade for 10 minutes and the recombination center region 20 obtained after the final manufacturing process was Polycrystalline.

This Si ion implantation and subsequent heat treatment was performed on a sample under conditions identical to the conditions for this embodiment an upon conducting an optical measurement of the recombination characteristics, the recombination time was found to be within an exceedingly short $10^{-10}$ seconds and the Polycrystalline Si implanted region was confirmed to play a role as the recombination center region 20.

Following the above mentioned high dose ion implantation process, a method of the known art such as sputtering was utilized to form a metallic wiring layer constituted mainly of thin TiN as well as aluminum. Patterning according to the desired circuit configuration was performed and wiring formed containing the source electrode 12 and the drain electrode 13 to form the semiconductor device shown in FIG. 1.

In this manufacturing process, instead of utilizing ion implantation, a consecutive contact hole can also be formed into the single crystalline silicon layer 3 after forming of the contact hole 19 in the inter-metal insulator 11 and when then forming the metallic wiring layer, the single crystalline silicon layer 3 formed with the contact hole can be refilled by the metallic wiring layers 12 and 13 in a structure with the source diffusion region 9 and the single crystalline silicon layer 3 simultaneously shorted. A recombination center region 20 can thus be formed as specified by means of the metal-semiconductor junction between the metallic wiring layers 12 and 13 and the single crystalline silicon layer 3. In this case, the recombination center region 20 with boundaries specified by the metal-semiconductor junction, is positionally aligned with the source electrode 12 and the drain electrode 13. Even if the recombination center region 20 is formed by means of metal-semiconductor junctions in this manner, the characteristics will be absolutely identical to the case when the recombination center region 20 was formed by ion implantation and this structure was confirmed to be remarkably effective in eliminating the body floating effect.

The source—drain breakdown voltage of the semiconductor device of this embodiment was 5.7 volts, an improvement of 2.5 volts compared to an SOI-MOS device of the conventional art fabricated to the same dimensions and not having a recombination center region 20 formed by Si ion implantation. The semiconductor device of this embodiment also maintained the same breakdown voltage characteristics as a MOS of the same dimensions manufactured on the usual semiconductor substrate. Further, in terms of electrical current and voltage characteristics, the abnormal hump characteristic referred to as the kink characteristics was not observed and normal characteristics were shown. Further, as a function of gate voltage, the dependence of source-drain current resulting in leakage current observed as a low gate voltage in SOI-MOS devices of the conventional art was not found in the SOI-MOS device of this embodiment. Also the characteristic observed in SOI-MOS devices of the conventional art in which fluctuations occurred due to the dependence of the threshold voltage on the drain voltage was not observed in this embodiment. The fact that a leakage current at a low gate voltage was not observed in this embodiment shows that the recombination center region (Si ion implantation region) 20 formed in contact with the bottom surface of the drain diffusion region 10 does not exert an adverse affect on the transistor characteristics.

These results clearly show that the semiconductor device of this embodiment is completely free from the problems causing by the body floating effect found in SOI-MOS devices of the conventional art.

The above results allow concluding that the holes emitted by the strong electric field of the drain and injected into the P-type single crystalline silicon layer 3 beneath the source diffusion region 9, are ejected into the recombination center region 20 and completely eliminated. Also, the fact that no leakage current was observed is due to the P-type single crystalline silicon layer 3 beneath the drain diffusion region 10 being depleted upon application of a drain voltage so that the current flow path for to the recombination center region 20 beneath the drain diffusion region 10 is cut off and therefore no abnormalities occurs in the current voltage characteristics.

The source and drain were replaced in each of the above measurements yet no differences were found which demonstrates that drain and source are symmetrical in the semiconductor device of this invention. These results further demonstrate that the semiconductor device of this invention can be applied to bidirectional transistors (transfer MOS) in which the role of the source and drain are replaced by means of the operational timing.

(Second Embodiment)

Figure 8:
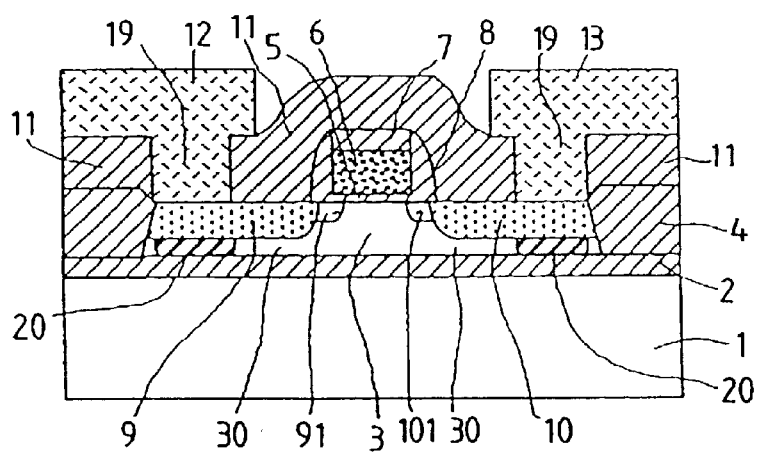
FIG. 8 is a cross sectional view showing the second embodiment of this invention.

The second embodiment of this invention is described while referring to FIG. 8. First of all, just as with the first embodiment, after forming the gate electrode 6, arsenic (As) ions are implanted into the single crystalline layer 3 with the gate 6 as an ion implantation screen mask, subsequent activizing heat treatment performed, and an extremely shallow N-type source diffusion region 91 with a junction depth of 30 nm and an N-type drain diffusion region 10 are formed. The ion implantation was performed at an acceleration energy of 10 keV, and an ion implantation dosage of $2\times10^{14}/cm^2$. The ion input (incident) angle was 20 degrees relative to a position perpendicular to the substrate surface.

Next, after forming the gate side-wall insulator 8 in the same manner as the first embodiment, a source diffusion region 9 and a drain diffusion region 10 were formed by ion implantation with deeper depth and a higher concentration than the above mentioned N-type source diffusion region 91 and N-type drain diffusion region 101. After further forming the inter-metal insulator 11, the contact hole 19 was formed at the desired location according to the first embodiment.

The recombination center region 20 was selectively formed with the same method as the first embodiment to contact the bottom surfaces of the source and drain diffusion regions 9 and 10 as well as the upper surface of the insulator (oxide layer) 2 within the single crystalline silicon layer 3 beneath the contact hole 19. However, in this embodiment the recombination center region 20 was formed by implantation of $BF_2$ ions instead of silicon (Si).

Processing just as in the first embodiment was performed and the wiring formed containing the source electrode 12 and the drain electrode 13 and the semiconductor device thus manufactured as shown in FIG. 8.

The semiconductor device formed in this embodiment showed the same characteristics as the semiconductor device of the first embodiment and though confirmed as effective in eliminating the SOI-MOS body floating effect, the current embodiment had a source—drain breakdown voltage an additional 2 volts higher than the semiconductor device of the first embodiment and furthermore had no gate induced drain leakage phenomenon in which a source-drain leakage current tends to increase when the applied negative gate voltage is increased. This absence of gate induced drain leakage is due to a weakening of the electric field of the drain due to the shallow drain diffusion region 101. The strong electric field of the drain just beneath the gate which occurs due to application of a negative gate voltage consequently weakened so no gate induced drain leakage was observed.

Figure 20:
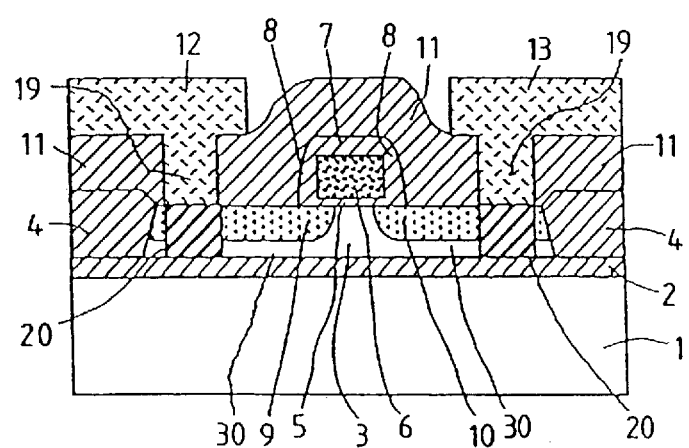
FIG. 20 is drawing showing the overall configuration of this invention.

In this embodiment also, the recombination center region 20 may be formed by means of the metallic wiring layer 19 as shown in FIG. 20.

(Third Embodiment)

Figure 9:
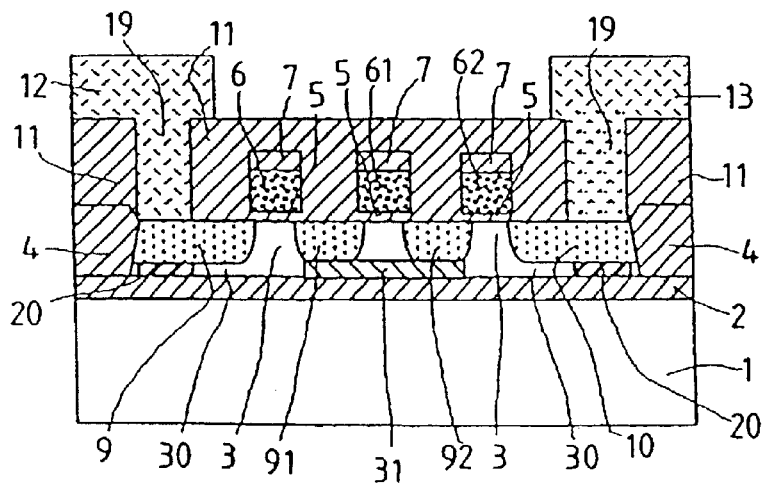
FIG. 9 is a cross sectional view showing the third embodiment of this invention.
Figure 10:
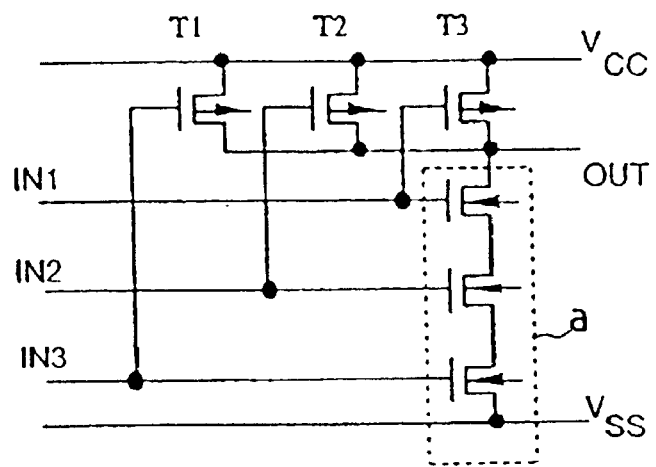
FIG. 10 is a schematic diagram of the NAND circuit illustrating the third embodiment of this invention.

A cross sectional view of the third embodiment of this invention is shown in FIG. 9. FIG. 10 is a NAND gate logic circuit formed utilizing a portion of the semiconductor device shown in FIG. 9. In FIG. 10 the plurality of transistors enclosed by the broken line "a" are all transistors having the same structure as shown in FIG. 9.

As shown in FIG. 9, in this embodiment, gate electrodes 6, 61, and 62 are formed at specified sections of the P-type single crystalline silicon layer 3 separated by a device isolation layer 4 and an insulator 2. The source diffusion region 9 and the drain diffusion region 10 are respectively connected to the source electrode 12 and the drain electrode 13.

Also, prior to forming the gate electrodes 6, 61, 62 onto the single crystalline silicon layer 3 below the bottom surface of the N-type highly concentrated diffusion regions 91 and 92, B ion implantation is performed beforehand and a P-type impurity region 31 is formed at a relatively high impurity concentration to a maximum of $1 \times 10^{18}/cm^3$. Portions other than mentioned above are processed in the same manner as the first embodiment.

As shown in FIG. 10, three P-channel MOS transistors $T_1$, $T_2$, $T_3$ are formed separately on a portion of the SOI substrate, in the manufacturing process differing from that of the first embodiment. The gate electrodes for these three P-channel MOS transistors $T_1$, $T_2$, $T_3$ are respectively connected to the above mentioned MOS gates 6, 61, and 62 shown in FIG. 9. These mutually connected gate electrodes are respectively the inputs IN1, IN2, and IN3 of the respective NAND gates.

In FIG. 10, the symbol OUT, is the NAND gate output, Vcc is power supply line voltage and Vss is the earth voltage.

In the semiconductor device of this embodiment, the positive carriers emitted at the edge of the drain diffusion region 10 arrive and are ejected into the recombination center region 20 at the bottom of the source diffusion region 9 by way of the highly-concentrated impurity region 31 regardless of the input, in whatever order a voltage is applied to the inputs IN1, IN2 and IN3. This phenomenon is not dependent on the voltage potential of the diffusion regions 91 and 92. Accordingly, in the semiconductor device of this embodiment, just as with the first embodiment, no evidence of the body floating effect was observed and the characteristics of the semiconductor device of this embodiment were confirmed as satisfactory.

(Fourth Embodiment)

Figure 11:
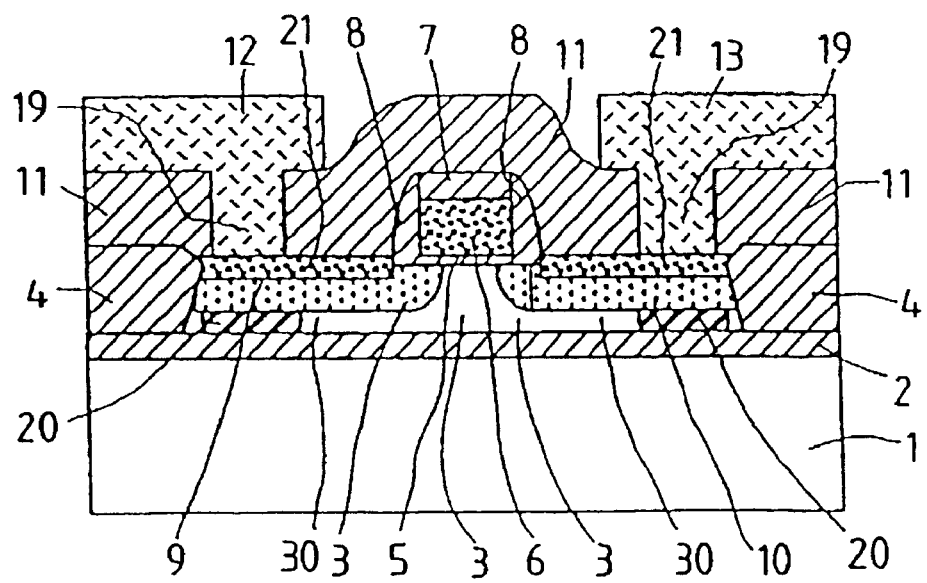
FIG. 11 is a cross sectional view showing the fourth embodiment of this invention.

A cross sectional view of the semiconductor device of the fourth embodiment of this invention is shown in FIG. 11. The source and drain diffusion regions 9 and 10 with a high concentration of impurities as well as a gate side-wall insulator 8 were formed with processing identical to that of the first embodiment. Next, heat treatment was performed after forming a cobalt (Co) layer over the entire surface, and siliciding of the cobalt (Co) layer on the exposed portion of the source and drain diffusion regions 9 and 10 performed to selectively form a cobalt silicide layer 21 with a thickness of 50 nm, and selectively remove a non-reactive cobalt (Co) layer formed on the gate electrode protective insulator 7 and the device isolation layer 4, etc. Silicide alloy of a refractory metals such as titanium silicide, tungsten silicide, molybdenum silicide or nickel silicide or even a refractory metal layer itself may be used instead of the cobalt silicide layer 21.

The next processing was performed in the same manner as the first embodiment but argon (Ar) was utilized as the ion species for ion implantation by way of the connecting hole or contact area 19. The acceleration energy was set at 150 keV for the implanted argon to penetrate the cobalt silicide layer 21 and reach the interface of the single crystalline silicon layer 30 and the insulator 2, and the recombination center region 20 formed. Other manufacturing conditions were the same as the first embodiment. Also, after the argon implantation, heat treatment at 700° C. was performed to lower the resistance of the cobalt silicide layer 21.

In this embodiment, despite the fact that the maximum heat treatment temperature after forming the recombination center region 20 was a low temperature of 700° C., the resistance of the cobalt silicide layer 21 was sufficiently lowered. Furthermore, except for the region ion-implanted with the argon, the contact resistance between the cobalt silicide layer 21 and high impurity source and drain diffusion regions 9, 10 was sufficiently lowered and the series source resistance could also be lowered sufficiently. As a result, the recombination center region 20 was formed without exerting any adverse effects on the transistor characteristics and the SOI-MOS floating body effect was eliminated just the same as in the first embodiment.

In this embodiment also, the recombination center region 20 may be formed by means of the metallic wiring layer 19 as shown in FIG. 20 rather than ion implantation.

(Fifth Embodiment)

Figure 12:
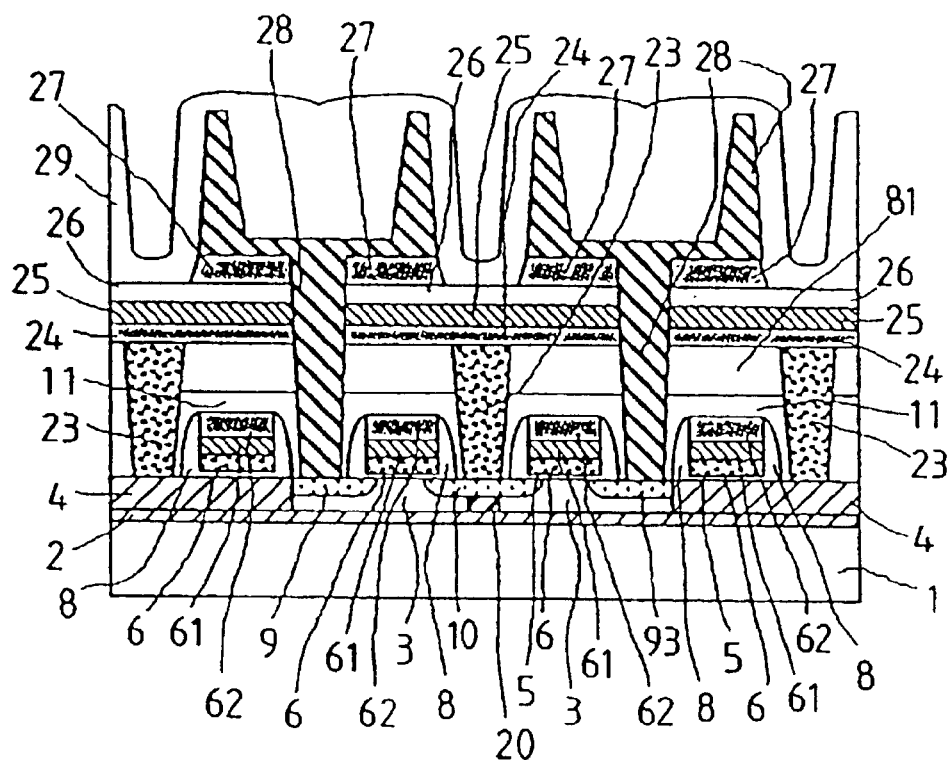
FIG. 12 is a cross sectional view showing the fifth embodiment of this invention.
Figure 13:
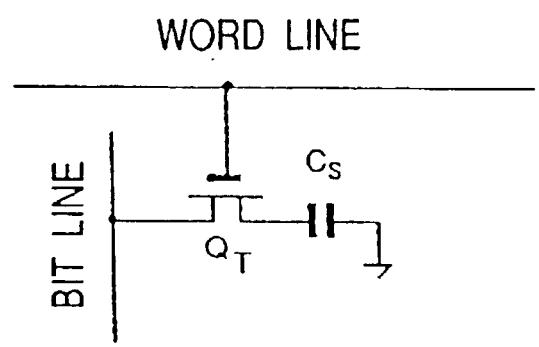
FIG. 13 is a schematic diagram illustrating the fifth embodiment of this invention.
Figure 14:
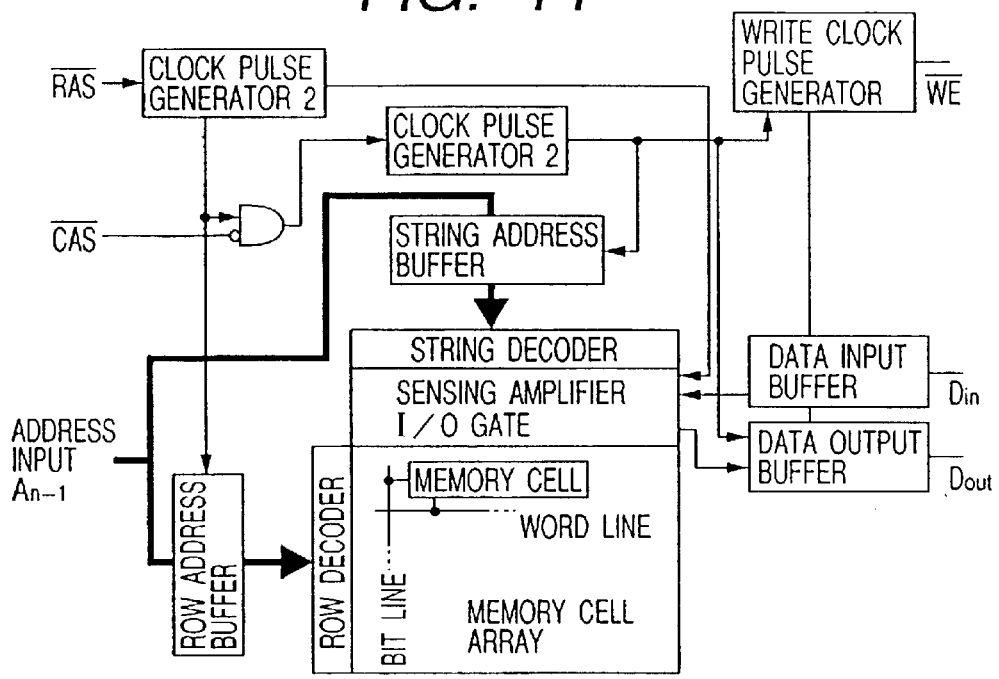
FIG. 14 is a structural view of the DRAM (dynamic memory) device for illustrating the fifth embodiment of this invention.

FIG. 12 is a cross sectional view showing the fifth embodiment of this invention. FIG. 13 is a schematic illustrating the semiconductor device of the fifth embodiment of this invention. FIG. 14 is a structural view of the DRAM(dynamic memory) device of the fifth embodiment of this invention.

After forming the device isolation layer 4 and the gate insulator (gate oxide) 5 with the same processing as the first embodiment, a gate electrode (word line) is formed consisting of a heavily P-doped Polycrystalline Si layer 6 as well as a TiN/W double layer 61 as shown in FIG. 12 and a silicon nitride gate electrode protection insulator 62 consisting of a silicon nitride layer is formed above the Polycrystalline Si layer 6. Next, after selectively forming a gate side-wall protective insulator 8 from a silicon nitride layer on the side wall of the above mentioned gate electrode by a method of the known art, ion implantation of arsenic (As) into the single crystalline silicon layer 3 is performed as an implantation screen mask such as for the gate electrode, heat treatment activation performed and N-type highly-concentrated diffusion regions 9, 10 and 93 formed as the source and drains.

Next, an intermetal insulator layer 11 consisting of an SiO2 film utilizing a CVD (chemical vapor deposition) method of the conventional art is formed over the entire surface and after further forming a second level inter-level metal insulator 81 over the entire surface, the surface is flattened by performing chemical mechanical Polishing with a method of the known art.

Contact holes are formed by utilizing photo etching of the known art at specified portions of the inter-metal insulators 11 and 81 and the surface of the diffusion layer 10 connected to the bit line is exposed. Silicon ions are implanted through the contact hole formed in that process and a recombination center region 20 contacting the upper surface of the insulator (oxide layer) 2 and the bottom surface of the diffusion region is formed in the single crystalline silicon layer 3. Any ion species may be used as the ion implantation provided that implanted region does not form barrier to the flow of holes. Instead of Ar (argon) as an implantation species, a Group IV fundamental elements such as Ge, rare earth gases such as neon (Ne) or halogen gases such as chlorine (Cl) may be used. An boron (B) implantation additive forming a P-type conductive may also be used. However, when ion implantation that forms N-type conductive such as phosphorus (P) or arsenic (As) is performed, barriers to hole flow are formed and the capability to eliminate body-floating effect drops drastically so this type of ion implantation is not preferred.

An amorphous silicon layer 23 heavily doped with phosphorus is formed over the entire surface and after filling the contact holes, the silicon layer 23 in portions other than in the contact holes is removed by a chemical-mechanical Polishing process of the known art. A laminated layer consisting of an amorphous silicon layer 23 and a tungsten silicide layer 25 is formed, patterning performed according to the desired circuit configuration and bit lines formed.

After forming the laminated layers of the silicon oxide layer 26 and the silicon nitride layer 27, a (through) hole is formed by photo etching with a method of the known art to penetrate through the silicon nitride layer 27, the silicon oxide layer 26, the second-level metal insulator 81 and the inter-metal insulator 11. The surfaces of the N-type highly concentrated impurity diffusion regions 9, 93 are then exposed to function as capacitor element connection nodes. Further, the P-doped amorphous silicon layer 28 is formed over the entire surface and filled into the above mentioned contact holes.

In FIG. 12, the amorphous silicon layer 28 filled inside the contact holes appears to intersect the bit lines 24 and 25 however the cross section of the capacitor element connection nodes is listed on the drawing at the same cross section as the bit line connecting holes and actually have mutually different cross sections which do not contact each other.

After filling the capacitor element connection node connection holes with the P-doped amorphous silicon layer 28, an $SiO_2$ layer (not shown in the drawing) with a thickness of approximately 2 $\mu$m is formed over the entire surface of the amorphous silicon layer 28. A tubular protruding pattern is then formed by photo etching using a method of the known art. The P-doped amorphous silicon layer is left only on the side walls of this protruding pattern by using a method of the known art for anistrophic etching on a P-doped amorphous silicon layer and an electrode 28 for one of the capacitor element formed.

After removing the above mentioned tubular protruding pattern, a thin insulator layer (not shown in the drawing) made from a silicon nitride layer and a matching electrode referred to as plate electrode 29 made from a TiN are formed on the surface of the above mentioned one exposed electrode 28 by utilizing a method of the known art.

The semiconductor device of this embodiment having the memory units shown in FIG. 13 is comprised with a DRAM (dynamic memory) device as the main component. In other words, a memory cell is formed by serially connecting one semiconductor device $Q_T$ of this invention with one capacitor $C_S$, and the memory cell then connected to a bit line for data transmission and a word line for input/output control.

The DRAM (dynamic memory) device is comprised of memory cells made up of memory cell arrays arranged in a matrix and peripheral control circuits. The peripheral control circuits also, are comprised of the semiconductor device of the first embodiment. In order to reduce the number of memory cell select address signal terminals, the string address signals and row address signals are shifted and multiplexed. The RAS and CAS are the pulse signals. These RAS and CAS pulse signals control the clock generators 1 and 2 and distribute the address signals to the row decoder and string decoder. The designated word line and bit lines are selected according to the address signal allocated from the row decoder and string decoder by means of an address buffer (circuit). A sensing amplifier is connected by means of a flipflop type amplifier to each bit line to amplify the signals read out from the memory cells. A pulse signal WE controls the switching between writing and read out by controlling a write clock generator. The pulse signal D is a write and read signal.

The semiconductor device of this embodiment eliminates the body floating effect, not just in the peripheral control circuits but in the memory cell array as well. The memory cell refresh characteristic which determines the DRAM power consumption has been improved approximately 10 times over the conventional art in a 16 megabit memory configuration and is 0.8 seconds even in the worst case. This high speed operation was achieved by reducing the parasitic capacitance by means of the SOI structure. The improvement in the refresh characteristic may be attributed to reducing the junction surface area in the SOI structure and removing fluctuations in threshold voltage by eliminating the body floating effect however, since the recombination center region 20 used to eliminate the body floating effect is only formed beneath the bit line diffusion layer 10 and is not formed beneath the highly concentrated impurity diffusion regions 9 and 93 of the capacitor element connection nodes, the junction characteristics of the diffusion regions 9 and 93 for the capacitor element connection nodes are not affected and no increase in leakage current occurred.

(Sixth Embodiment)

Figure 15:
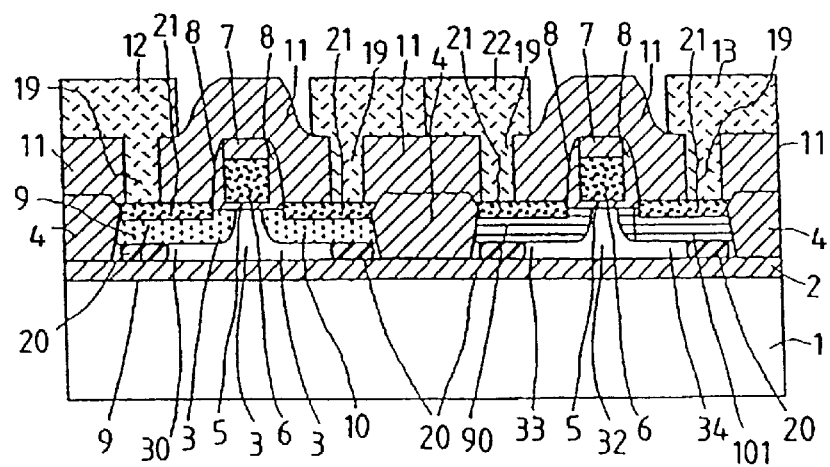
FIG. 15 is a cross sectional view showing the sixth embodiment of this invention.
Figure 16:
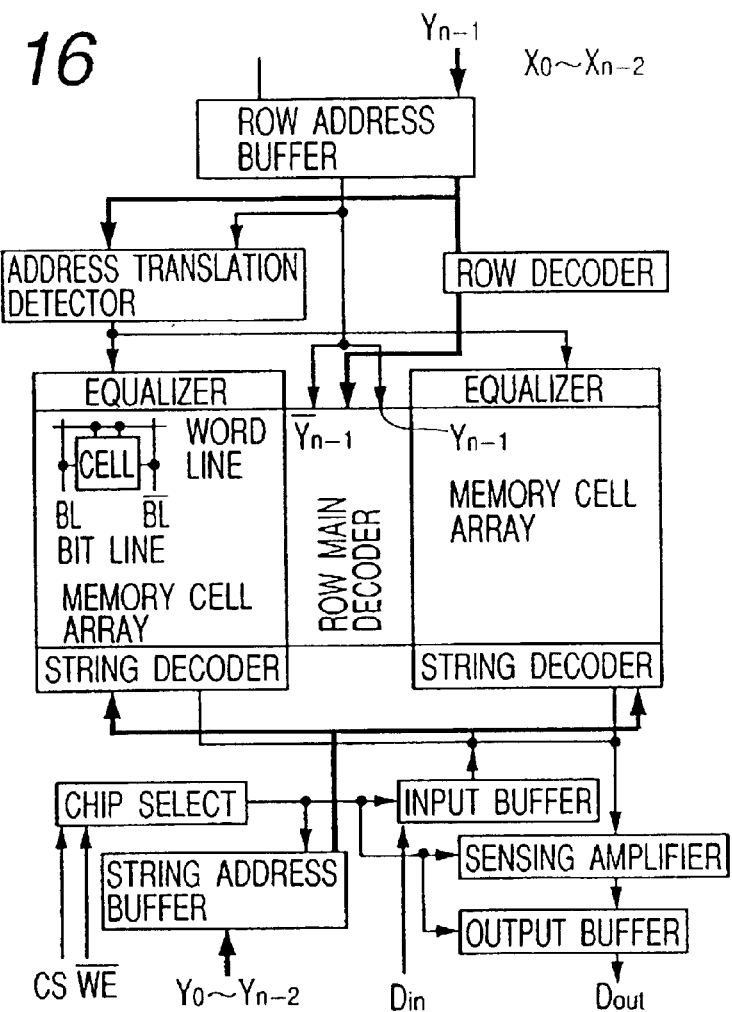
FIG. 16 is a structural view of the SRAM device for illustrating the sixth embodiment of this invention.
Figure 17:
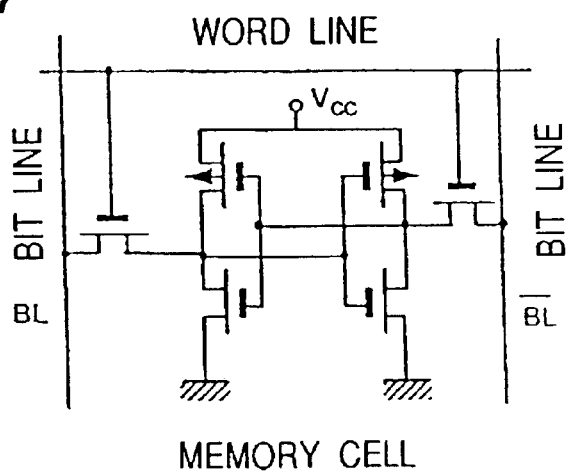
FIG. 17 is a schematic diagram illustrating the sixth embodiment of this invention.

FIG. 15 is a cross sectional view showing the sixth embodiment of this invention. FIG. 16 is a structural view of the SRAM (statistically read out and write memory) device for illustrating the sixth embodiment of this invention. A schematic illustrating the sixth embodiment of this invention is shown in FIG. 17.

In the fourth embodiment, after forming a device isolation layer 4 and separating the active region of the P-type single crystalline silicon layer 3, the phosphorus ion implantation processing and activating heat treatment is performed according to the desired circuit configuration for changing the conduction direction of the activized region in the silicon layer 3 and controlling the threshold voltage value, and the low-concentrated N-type single crystalline layer 32 is formed.

Just the same as for the fourth embodiment, a gate electrode 6 consisting of a gate insulator layer 5 and W layer and also a gate electrode protection insulator 7 are formed in sequence on the low-concentrated P-type single crystalline silicon layer 3 (portion not P-doped) and the low-concentrated N-type single crystalline layer 32.

A gate electrode 6 is utilized as the mask the same as in the fourth embodiment and As (arsenic) implanted into the low-concentrated P-type single crystalline silicon layer 3 side and $BF_2$ ions implanted into the low-concentrated N-type single crystalline layer 32 side at an implantation angle of 20 degrees relative to the surface. Activation heat treatment was then performed and the N-type source diffusion region 9, the N-type drain diffusion region 10, the P-type source diffusion region 101 as well as the P-type drain diffusion region 90 were formed.

The acceleration energy for each type of ion implantation was set to attain a final thickness of 10 nm for the single crystalline silicon layer 3 between the upper surface of the insulator layer 2 and the bottom surfaces of the source and drain diffusion regions 9, 10, 90 and 101.

Next, a gate side-wall insulator 8 with a thickness of 100 nm, a cobalt silicide layer 21, an inter-metal insulator 11 and a recombination center region 20 were formed with the same processing as for the fourth embodiment. Metallic wiring containing a ground potential electrode 12, an output node electrode 22 as well as a power supply electrode 13 were formed as shown in the structure of FIG. 15.

In the semiconductor device (CMOS) of this embodiment, formed as described above, no problems that might serve as factors in the body floating effect were observed in either the PMOS or nMOS configurations and no penetrating current which is evidence of the SOI-CMOS characteristic body floating effect was observed to occur due to negative fluctuations in the threshold voltages of the nMOS or positive fluctuations in the pMOS threshold voltage, between the ground potential electrode 12 and the power supply electrode 13.

The fact that no body floating effect was observed in the pMOS device is accounted for by the electrons (minority carriers) generated in the channel of the single crystalline layer 32, being injected into and eliminated in the recombination center region 20 formed beneath the P-type source diffusion region 10. In the semiconductor device of this embodiment, the body floating effect in the pMOS and nMOS devices can be eliminated with one ion implantation and a high performance CMOS device can be achieved at a low production cost without a complex manufacturing process.

The SRAM device shown in FIG. 16 was formed by utilizing the semiconductor device of this embodiment shown in FIG. 15. In this SRAM, a memory cell constituting one memory unit, is formed with two CMOS pairs of this embodiment and two MOS (transfer MOS) devices to control signal input and output. This SRAM is formed of peripheral control circuits and memory cell arrays having memory cells arranged in a matrix however, the peripheral circuits were also formed by utilizing the semiconductor device of this embodiment.

The SRAM of this embodiment shown in FIG. 16 is basically the same as the fifth embodiment shown in FIG. 14 however an address translation detector was installed to attain a high speed, low power consumption SRAM and the internal circuitry controlled by pulses emitted from this detector. Further, to attain high speed in the circuit from the address buffer to the decoder, a row decoder was formed in two stages from a predecoder and a main decoder. The chip select is a circuit designed to avoid data conflicts during reading and writing of information by way of the CS and WE signals and also to allow high speed operation.

Since this SRAM made use of an SOI-CMOS device of this embodiment that eliminated the body floating effect, the power supply voltage was reduced from 3.5 volts to 2.0 volts, the access time was reduced more than 35 percent compared to the prior art and high speed operation was achieved. These effects were obtained by the reduced stray capacitance in the SOI-CMOS structure. Further, threshold voltage fluctuations were removed by eliminating the body floating effect and the operating range of the sensing amplifier was reduced and high speed operation achieved.

(Seventh Embodiment)

Figure 18:
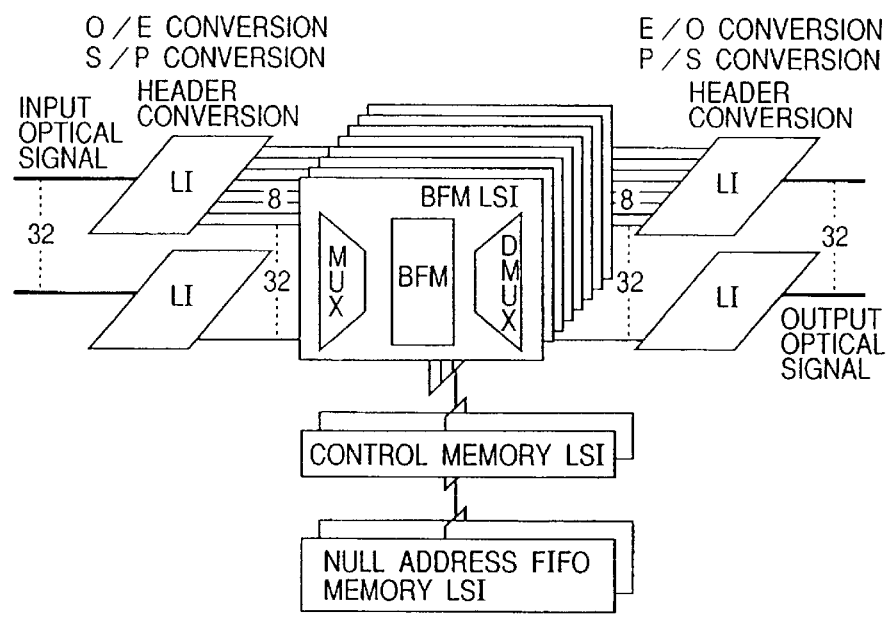
FIG. 18 is a structural view of the asynchronous transmission mode (ATM) system for illustrating the seventh embodiment of this invention.

FIG. 18 is a structural view of the asynchronous transmission mode (ATM) system illustrating the seventh embodiment of this invention. This is a signal transmission processing unit involving an asynchronous transmission method (called ATM switching) and made by utilizing the semiconductor device of this embodiment.

In FIG. 18, the information signal serially transmitted at high speed by way of optical fibers is sent by way of a device that converts the optical information to an electrical signal (O/E conversion) and to parallel data (S/P conversion) and input to an integrated circuit (BFMLSI) configured utilizing the semiconductor device of this invention as shown in claims 1 through claim 8.

The electrical signal address-processed by this integrated circuit is output by an optical fiber after electrical/optical (E/O) conversion and parallel/serial conversion (P/S) are performed. The above mentioned BFMLSI integrated circuit is comprised of a multiplexer (MUX), buffer memory (BFM) and a demultiplexer (DMUX). The BFMLSI is controlled by a memory control LSI, and an LSI having a function to allot null addresses (null address FIFO memory LSI).

The signal transmission processing unit of this embodiment has a switching function to send a high speed transmit signal independent on the address for transmission, to the desired address at high speed. The BFMLSI has an operating speed that is drastically slower than the transmission speed of the optical signal being input so the BFMLSI cannot directly switch the signal that is input. The input signal is therefore temporarily stored and after switching the stored signal, a method to convert the input to a high speed optical signal and send it to the desired address is utilized. The slower the operating speed of the BFMLSI, the greater the memory capacity that is required. However, in the ATM switcher of this embodiment, the BFMLSI is made by utilizing the semiconductor device of this invention. Therefore, compared to the conventional art, the BFMLSI of this embodiment has an operating speed that is three times faster, the necessary memory capacity of the BFMLSI has been reduced to approximately one-third compared to the conventional art and a great reduction in the price of the ATM switcher can be achieved.

(Eighth Embodiment)

Figure 19:
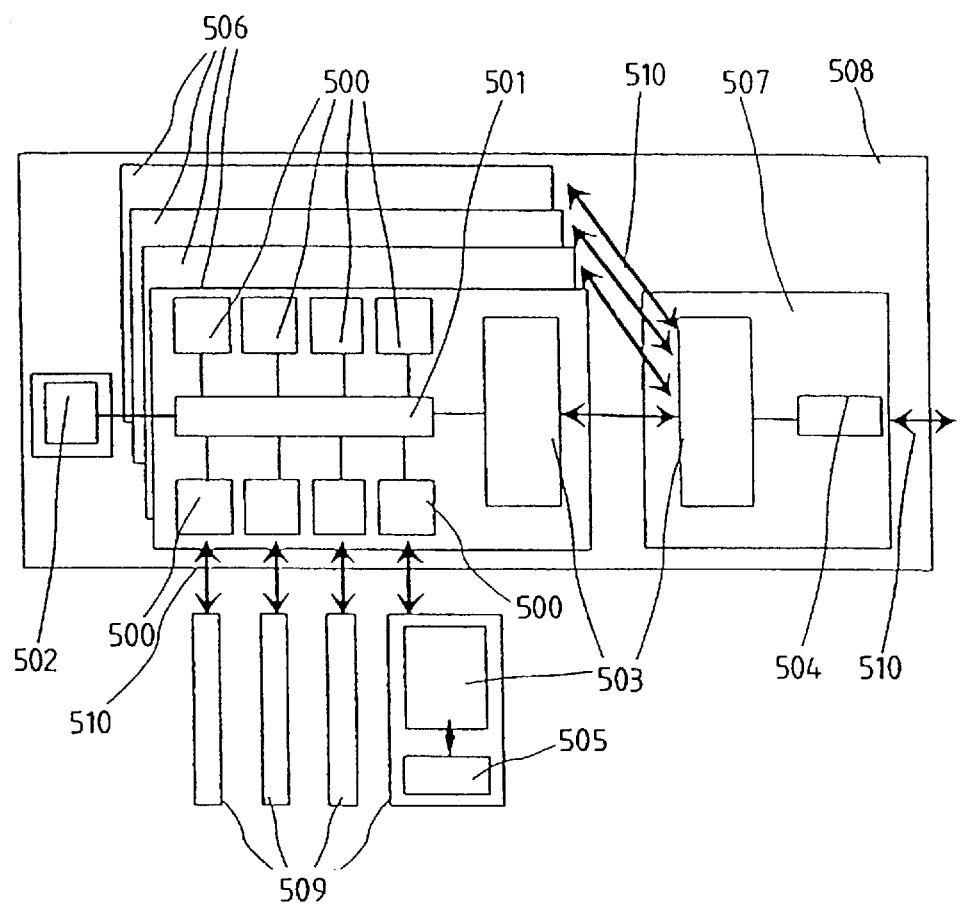
FIG. 19 is a cross sectional view of the computer illustrating the eighth embodiment of this invention.

FIG. 19 is a structural view of the computer illustrating the eighth embodiment of this invention. This working example described in the eighth embodiment of this invention is adapted for large, high speed computers connected with a plurality of processors 500 in parallel for processing commands and arithmetic operations.

The semiconductor device of this invention has a higher density and lower cost than the integrated circuit of the conventional art using bipolar transistors so that components such as a processor 500, a system control unit 501 and a main memory unit 502 can be formed with sizes having dimensions from 10 to 30 mm. This processor 500, a system control unit 501 as well as a data communication interface 503 made from a compound semiconductor device are mounted on the same ceramic substrate 506. Also, the data communication interface 503 and a data communication control unit 504 are mounted on the same ceramic substrate 507.

The central processing unit (CPU) 508 of the computer is comprised of the ceramic substrates 506 and 507 and the ceramic substrate mounted with the main memory unit 502. These ceramic substrates have a size of approximately 50 centimeters or less on one side. The internal data communication of this central processing unit (CPU) 508 and the data communication with a plurality of other central processing units (CPU) 508 or the data communications between the data communication interface 503 and input/output processor 505 packaged substrates are performed by way of the optical fiber 510 shown with the two-way arrow lines in FIG. 19.

The semiconductor device of this invention utilized in the processor 500, a system control unit 501 and the main memory unit 502 operate in parallel and at high speed, and data communications are performed using light as the medium so that the number of commands processed per second can be greatly increased.

This invention configured as described above, can eliminate the body floating effect which is the most serious problem in semiconductor devices formed on SOI substrates. This invention, without increasing the occupation area can also prevent generation of the kink characteristic in device current/voltage characteristics and the fluctuating threshold voltages that also cause the body floating effect. This invention also eliminates the body floating effect on p-MOS devices formed on SOI substrates and can also eliminate the body floating effect on CMOS devices formed on SOI substrates. A semiconductor device having extremely high speed and low power consumption as well as a variety of systems using such a semiconductor device can therefore be achieved.

A further effect is that the semiconductor device of this invention can be made merely by a combination of semiconductor production technology of the conventional art so there is no need to develop new production technology. Accordingly, a high performance SOI-MOS device in which the body floating effect is eliminated and having no latchups or misoperation caused by alpha rays irradiation, can be easily produced at a low cost.

What is claim is:

1. A semiconductor device comprising:
   an insulator layer formed on a wafer,
   a single crystalline semiconductor layer formed on said insulator layer, and
   a MOS field effect transistor formed on said single crystalline semiconductor layer,
   wherein said single crystalline semiconductor layer comprises a first conductivity type region and a second conductivity type region being opposite conductivity type to said first conductivity type region,
   wherein said first conductivity type region functions as one of a source region and a drain region of said MOS field effect transistor,
   wherein a lower surface of said first conductivity type region is formed apart from said insulator layer,
   wherein a recombination center region is formed inside said second conductivity type region and contacting a lower surface of said first conductivity type region, and
   wherein an edge of said recombination center region is positioned apart from an edge of said first conductivity type region, and contacting both said first conductivity type region and said second conductivity type region.

2. A semiconductor device according to claim 1, wherein a lower surface of said recombination center region contacts an upper surface of said insulator layer.

3. A semiconductor device according to claim 1, wherein a lower surface of said recombination center region is separate from an upper surface of said insulator layer.

4. A semiconductor device according to claim 1, wherein said recombination center region is of the second conductivity type.

5. A semiconductor device according to claim 1, wherein said recombination center region is a non-single crystalline region.

6. A semiconductor device according to claim 1, wherein a portion of said single crystalline semiconductor layer between said first conductivity type region and said insulator layer becomes a depletion layer when a voltage is applied to said first conductivity type region.

7. A semiconductor device according to claim 1, wherein a pair of said first conductivity type regions are provided, functioning as the source and drain regions of said MOS filed effect transistor, and wherein a pair of said recombination center regions are provided, one contacting both the source region and the second conductivity type region and the other contacting both the drain region and the second conductivity type region.

* * * * *